(12) United States Patent
Otsubo et al.

(10) Patent No.: US 11,552,175 B2
(45) Date of Patent: Jan. 10, 2023

(54) SEMICONDUCTOR DEVICE

(71) Applicant: ROHM Co., LTD., Kyoto (JP)

(72) Inventors: Nobuyuki Otsubo, Kyoto (JP); Daisuke Ichikawa, Kyoto (JP); Yasushi Hamazawa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 203 days.

(21) Appl. No.: 16/908,799

(22) Filed: Jun. 23, 2020

(65) Prior Publication Data
US 2020/0403072 A1 Dec. 24, 2020

(30) Foreign Application Priority Data

Jun. 24, 2019 (JP) .............................. JP2019-116552

(51) Int. Cl.
| | |
|---|---|
| *H01L 27/092* | (2006.01) |
| *H01L 21/763* | (2006.01) |
| *H01L 21/8238* | (2006.01) |
| *H01L 29/40* | (2006.01) |
| *H01L 29/78* | (2006.01) |

(Continued)

(52) U.S. Cl.
CPC .......... *H01L 29/407* (2013.01); *H01L 21/763* (2013.01); *H01L 21/76224* (2013.01); *H01L 21/823878* (2013.01); *H01L 21/823892* (2013.01); *H01L 27/092* (2013.01); *H01L 27/0922* (2013.01); *H01L 29/1087* (2013.01); *H01L 29/7816* (2013.01)

(58) Field of Classification Search
CPC . H01L 27/0922; H01L 27/092; H01L 21/763; H01L 21/823892; H01L 29/7816; H01L 29/407; H01L 29/1087; H01L 29/0878; H01L 29/1083; H01L 29/0653; H01L 21/823878

See application file for complete search history.

(56) References Cited

U.S. PATENT DOCUMENTS 5,913,114 A * 6/1999 Lee .................... H01L 29/7809
  438/275
9,660,074 B2 * 5/2017 Cai ................... H01L 29/66689
(Continued)

FOREIGN PATENT DOCUMENTS

JP  2012244098 A  12/2012

*Primary Examiner* — Michael M Trinh
(74) *Attorney, Agent, or Firm* — Chip Law Group

(57) ABSTRACT

A semiconductor device includes a semiconductor substrate of a first conductivity type, a first semiconductor layer of the first conductivity type formed on the semiconductor substrate and having a first conductivity type impurity concentration higher than that of the semiconductor substrate, a second semiconductor layer of a second conductivity type formed above the first semiconductor layer, a first device region formed in the second semiconductor layer and configured to operate based on a first reference voltage, a second device region formed in the second semiconductor layer and configured to operate based on a second reference voltage, the second device region being spaced apart from the first device region, and a region isolation structure interposed between the first and second device regions and formed in a region extending from a front surface of the second semiconductor layer to the first semiconductor layer so as to electrically isolate the first and second device regions from each other.

5 Claims, 11 Drawing Sheets

(51) Int. Cl.
*H01L 21/762* (2006.01)
*H01L 29/10* (2006.01)

(56) References Cited

U.S. PATENT DOCUMENTS

| | | | |
|---|---|---|---|
| 10,256,133 B2* | 4/2019 | Usami | H01L 21/743 |
| 2017/0287912 A1* | 10/2017 | Tokumitsu | H01L 27/0623 |
| 2018/0294265 A1* | 10/2018 | Morii | H01L 23/528 |
| 2019/0096744 A1* | 3/2019 | Hu | H01L 29/7816 |

* cited by examiner

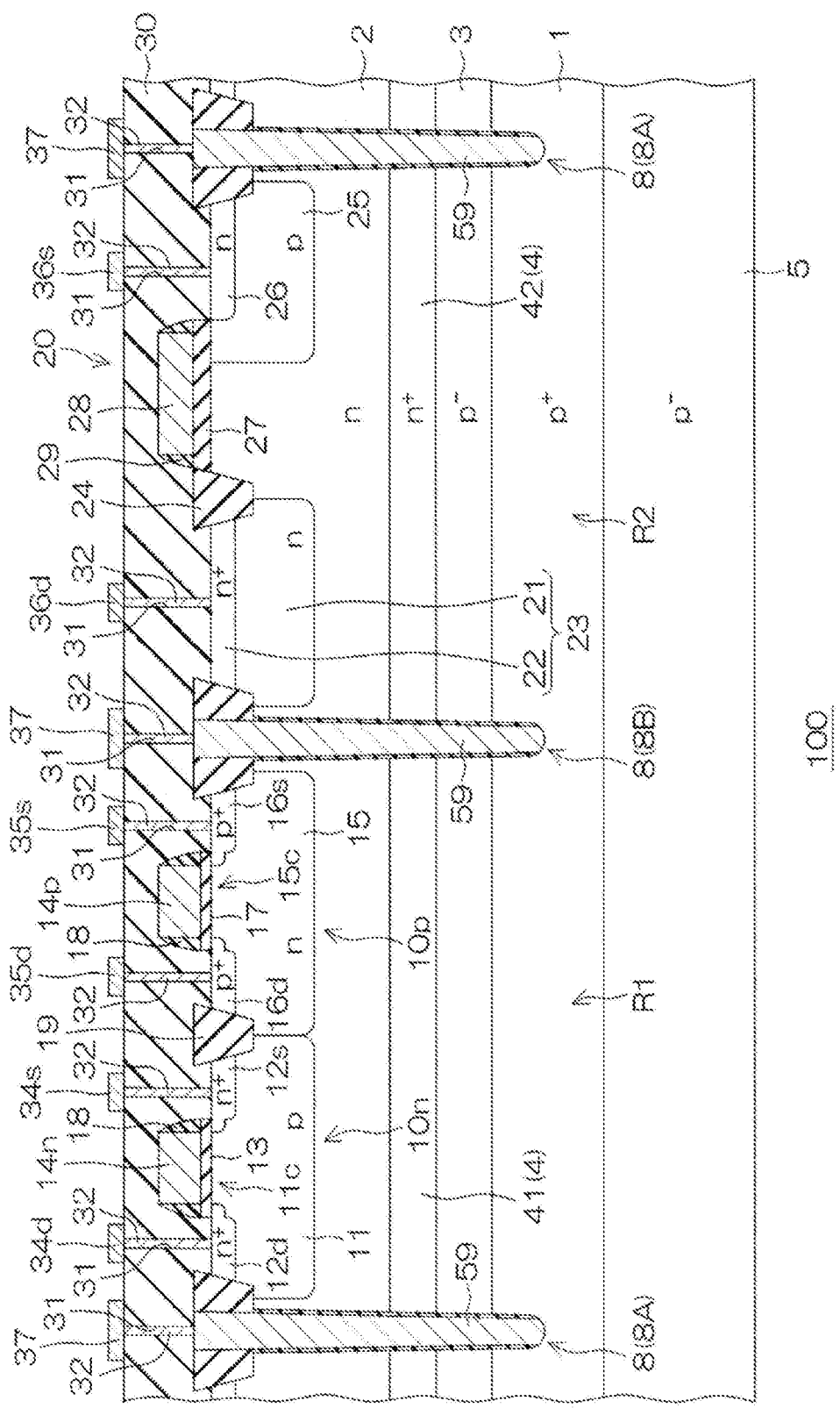
F I G. 2

SEMICONDUCTOR DEVICE

CROSS REFERENCE TO RELATED APPLICATIONS

This application claims the benefit of Japanese Priority Patent Application JP 2019-116552 filed Jun. 24, 2019, the entire contents of which are incorporated herein by reference.

BACKGROUND

The present disclosure relates to a semiconductor device.

A semiconductor device disclosed in Japanese Patent Laid-Open No. 2012-244098 (hereinafter referred to as Patent Document 1) includes an $n^-$-type epitaxial layer formed on a p-type semiconductor substrate and a p-type isolation layer separating the $n^-$-type epitaxial layer into a first portion and a second portion. A p-type metal-oxide-semiconductor (MOS) transistor and an n-type MOS transistor are formed in the first portion of the $n^-$-type epitaxial layer. An npn bipolar transistor is formed in the second portion of the $n^-$-type epitaxial layer.

The p-type isolation layer includes a p-type lower isolation layer and a p-type upper isolation layer. The p-type lower isolation layer is diffused upward and downward from a pn junction portion between the semiconductor substrate and the $n^-$-type epitaxial layer. The p-type upper isolation layer is diffused downward from a front surface of the epitaxial layer and has a lower end portion overlapping with the p-type lower isolation layer.

SUMMARY

When a semiconductor layer is separated into multiple regions as disclosed in Patent Document 1, devices in the separated regions operate based on different reference voltages. A region isolation structure such as the p-type isolation layer disclosed in Patent Document 1 suppresses leakage current between these separated regions.

However, the region isolation structure disclosed in Patent Document 1 has a leakage current path that extends from the $n^-$-type epitaxial layer in the first portion, passes under the p-type isolation layer in the p-type semiconductor substrate, and reaches the $n^-$-type epitaxial layer in the second portion. With this configuration, since the parasitic npn transistor is formed, it is difficult to obtain a sufficient region isolation performance depending on a potential relation among the first portion, the second portion, and the p-type semiconductor substrate. This may result in deterioration of device properties. Specifically, this may cause malfunction or noise.

Accordingly, it is desirable to provide a semiconductor device capable of improving the region isolation performance, thereby improving the device properties.

An embodiment of the present disclosure provides a semiconductor device including: a semiconductor substrate of a first conductivity type; a first semiconductor layer of the first conductivity type formed on the semiconductor substrate and having a first conductivity type impurity concentration higher than a first conductivity type impurity concentration of the semiconductor substrate; a second semiconductor layer of a second conductivity type formed above the first semiconductor layer; a first device region formed in the second semiconductor layer and configured to operate based on a first reference voltage; a second device region formed in the second semiconductor layer and configured to operate based on a second reference voltage different from the first reference voltage, the second device region being spaced apart from the first device region; and a region isolation structure interposed between the first device region and the second device region and formed in a region extending from a front surface of the second semiconductor layer to the first semiconductor layer so as to electrically isolate the first device region and the second device region from each other.

With this configuration, the first and second device regions formed in the second semiconductor layer of the second conductivity type are electrically isolated from each other by the region isolation structure and operate based on different reference voltages. The region isolation structure is formed in the region extending from the front surface of the second semiconductor layer to the first semiconductor layer of the first conductivity type. The first conductivity type impurity concentration of the first semiconductor layer is relatively high. Thus, the first semiconductor layer having the high first conductivity type impurity concentration is disposed in a current path that passes under the region isolation structure and straddles between the first and second device regions. Therefore, carriers entering the first semiconductor layer from the second semiconductor layer are lost due to recombination in the first semiconductor layer. This configuration can reliably suppress or prevent leakage current between the first and second device regions. This configuration can, therefore, improve the region isolation performance, thereby improving the device properties of the respective first and second device regions.

BRIEF DESCRIPTION OF THE DRAWINGS

FIG. 2 is a sectional view of a semiconductor device according to a first embodiment of the present disclosure, illustrating a sectional structure of the semiconductor device taken along line II-II of FIG. 1;

DETAILED DESCRIPTION OF THE
PREFERRED EMBODIMENTS

Hereinafter, embodiments of the present disclosure will be described in detail with reference to the accompanying drawings.

Figure 1:
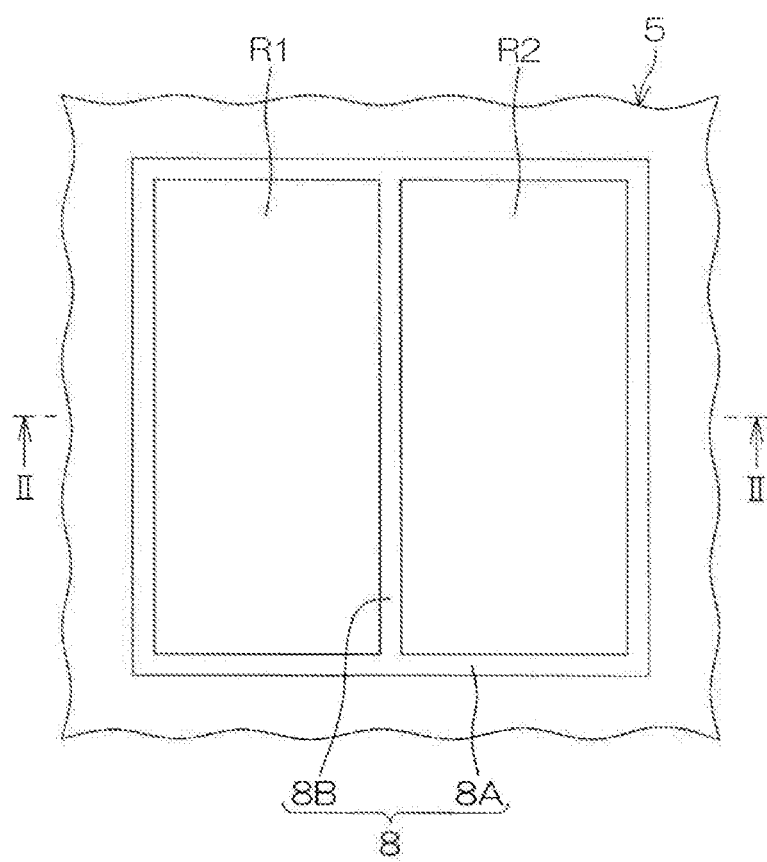
FIG. 1 is a schematic plan view of a semiconductor device according to an embodiment of the present disclosure.

FIG. 1 is a schematic plan view of a semiconductor device 100 according to an embodiment of the present disclosure, illustrating an arrangement of a region isolation structure 8 on a semiconductor substrate 5. The semiconductor device 100 includes a first device region R1 and a second device region R2, which are defined on the semiconductor substrate 5. The first device region R1 and the second device region R2 are defined by the region isolation structure 8. More specifically, the region isolation structure 8 includes an annular portion 8A and a boundary portion 8B. The annular portion 8A surrounds the first device region R1 and the second device region R2. The boundary portion 8B separates an inner side of the annular portion 8A into the first device region R1 and the second device region R2. In the present embodiment, the first device region R1 and the second device region R2 each have a rectangular shape. Accordingly, the region isolation structure 8 surrounds the first device region R1 in a rectangular form while surrounding the second device region R2 in a rectangular form.

The first device region R1 operates based on a first reference voltage. The second device region R2 operates based on a second reference voltage different from the first reference voltage. The first reference voltage is, for example, 1 V or higher and 10 V or lower. In the present embodiment, the second reference voltage is higher than the first reference voltage. The second reference voltage is, for example, 10 V or higher and 100 V or lower. In this manner, in the semiconductor device 100, the two device regions R1 and R2 with different reference voltages (operating voltages) are mounted (mixedly mounted) on the same semiconductor substrate 5. Alternatively, three or more device regions with different reference voltages (operating voltages) may be provided on the semiconductor substrate 5 and isolated from each other by the region isolation structure 8.

FIG. 2 is a sectional view of the semiconductor device 100 according to a first embodiment of the present disclosure, illustrating a sectional structure of the semiconductor device 100 taken along line II-II of FIG. 1. The semiconductor device 100 includes the semiconductor substrate 5 of a p$^-$-type (an example of a first conductivity type). In the present embodiment, the semiconductor substrate 5 is a silicon substrate. The p-type impurity concentration (first conductivity type impurity concentration) of the semiconductor substrate 5 is, for example, in the range of 1E+15 to 1E+16 cm$^{-3}$. The range of the p-type impurity concentration may include one or more of the following ranges: 1E+15 cm$^{-3}$ or more and less than 2E+15 cm$^{-3}$, 2E+15 cm$^{-3}$ or more and less than 3E+15 cm$^{-3}$, 3E+15 cm$^{-3}$ or more and less than 4E+15 cm$^{-3}$, 4E+15 cm$^{-3}$ or more and less than 5E+15 cm$^{-3}$, 5E+15 cm$^{-3}$ or more and less than 6E+15 cm$^{-3}$, 6E+15 cm$^{-3}$ or more and less than 7E+15 cm$^{-3}$, 7E+15 cm$^{-3}$ or more and less than 8E+15 cm$^{-3}$, 8E+15 cm$^{-3}$ or more and less than 9E+15 cm$^{-3}$, and 9E+15 cm$^{-3}$ or more and 1E+16 cm$^{-3}$ or less.

A p$^+$-type first semiconductor layer 1, which has a p-type impurity concentration higher than that of the semiconductor substrate 5, is formed on the semiconductor substrate 5. In the present embodiment, the first semiconductor layer 1 is a p$^+$-type epitaxial layer formed by crystal growth from a front surface of the semiconductor substrate 5. The layer thickness of the first semiconductor layer 1 is, for example, in the range of 4 to 8 μm. The range of the layer thickness of the first semiconductor layer 1 may include one or more of the following ranges: 4 μm or greater and less than 4.5 μm, 4.5 μm or greater and less than 5 μm, 5 μm or greater and less than 5.5 μm, 5.5 μm or greater and less than 6 μm, 6 μm or greater and less than 6.5 μm, 6.5 μm or greater and less than 7 μm, 7 μm or greater and less than 7.5 μm, and 7.5 μm or greater and 8 μm or less. The p-type impurity concentration (first conductivity type impurity concentration) of the first semiconductor layer 1 is, for example, in the range of 1E+18 to 1E+20 cm$^{-3}$. The range of the p-type impurity concentration may include one or more of the following ranges: 1E+18 cm$^{-3}$ or more and less than 2E+18 cm$^{-3}$, 2E+18 cm$^{-3}$ or more and less than 4E+18 cm$^{-3}$, 4E+18 cm$^{-3}$ or more and less than 6E+18 cm$^{-3}$, 6E+18 cm$^{-3}$ or more and less than 8E+18 cm$^{-3}$, 8E+18 cm$^{-3}$ or more and less than 1E+19 cm$^{-3}$, 1E+19 cm$^{-3}$ or more and less than 2E+19 cm$^{-3}$, 2E+19 cm$^{-3}$ or more and less than 4E+19 cm$^{-3}$, 4E+19 cm$^{-3}$ or more and less than 6E+19 cm$^{-3}$, 6E+19 cm$^{-3}$ or more and less than 8E+19 cm$^{-3}$, and 8E+19 cm$^{-3}$ or more and 1E+20 cm$^{-3}$ or less.

A second semiconductor layer 2 of an n type (an example of a second conductivity type) is disposed above the first semiconductor layer 1. A p$^-$-type third semiconductor layer 3 is disposed between the first semiconductor layer 1 and the second semiconductor layer 2.

The third semiconductor layer 3 has a p-type impurity concentration lower than the p-type impurity concentration of the first semiconductor layer 1. In the present embodiment, the third semiconductor layer 3 is a p$^-$-type epitaxial layer formed by crystal growth from a front surface of the first semiconductor layer 1. The layer thickness of the third semiconductor layer 3 is, for example, in the range of 6 to 13 μm. The range of the layer thickness of the third semiconductor layer 3 may include one or more of the following ranges: 6 μm or greater and less than 7 μm, 7 μm or greater and less than 8 μm, 8 μm or greater and less than 9 μm, 9 μm or greater and less than 10 μm, 10 μm or greater and less than 11 μm, 11 μm or greater and less than 12 μm, and 12 μm or greater and 13 μm or less. The p-type impurity concentration (first conductivity type impurity concentration) of the third semiconductor layer 3 is, for example, in the range of 1E+15 to 1E+16 cm$^{-3}$. The range of the p-type impurity concentration may include one or more of the following ranges: 1E+15 cm$^{-3}$ or more and less than 2E+15 cm$^{-3}$, 2E+15 cm$^{-3}$ or more and less than 4E+15 cm$^{-3}$, 4E+15 cm$^{-3}$ or more and less than 6E+15 cm$^{-3}$, 6E+15 cm$^{-3}$ or more and less than 8E+15 cm$^{-3}$, and 8E+15 cm$^{-3}$ or more and 1E+16 cm$^{-3}$ or less.

In the present embodiment, the second semiconductor layer 2 is an n-type epitaxial layer crystallized from a front surface of the third semiconductor layer 3. The layer thickness of the second semiconductor layer 2 is, for example, in the range of 6 to 13 μm. The n-type impurity concentration (second conductivity type impurity concentration) of the second semiconductor layer 2 is, for example, in the range of 1E+15 to 1E+16 cm$^{-3}$.

The region isolation structure 8 (the boundary portion 8B illustrated in FIG. 1) is disposed between the first device region R1 and the second device region R2 so as to electrically isolate the first device region R1 and the second device region R2 from each other.

An n+-type buried layer 41 is formed in the first device region R1. The buried layer 41 is formed so as to straddle a boundary between the second semiconductor layer 2 and the third semiconductor layer 3. The layer thickness of the buried layer 41 is, for example, in the range of 3 to 6 μm. The n-type impurity concentration (second conductivity type impurity concentration) of the buried layer 41 is, for example, in the range of 1E+18 to 1E+19 cm$^{-3}$.

In the first device region R1, an n-channel metal-insulator-semiconductor (MIS) transistor 10n (hereinafter referred to as "nMIS transistor 10n") and a p-channel MIS transistor 10p (hereinafter referred to as "pMIS transistor 10p") are formed. That is, a complementary metal insulator semiconductor (CMIS) structure is formed in the first device region R1. In the present embodiment, both the nMIS transistor 10n and the pMIS transistor 10p are planar-type MIS-field-effect transistors (FETs). The nMIS transistor 10n and the pMIS transistor 10p are, for example, of a low withstand voltage type with a withstand voltage of 1 V or higher and 10 V or lower (more specifically, for example, 1 V or higher and 5 V or lower, or 3 V or higher and lower than 10 V).

The nMIS transistor 10n includes a p-type well 11 which is formed in the second semiconductor layer 2. An n+-type source region 12s and an n+-type drain region 12d are formed in a surface layer portion of the p-type well 11. A channel region 11c is interposed between the n+-type source region 12s and the n+-type drain region 12d. An end portion of the source region 12s on the channel region 11c side and an end portion of the drain region 12d on the channel region 11c side are shallow in depth and have a low impurity concentration. This forms a lightly doped drain (LDD) structure that suppresses a short channel effect. A gate insulating film 13 is formed on the channel region 11c. The gate insulating film 13 may include a silicon oxide film. Alternatively, the gate insulating film 13 may include a silicon nitride film instead of or in addition to the silicon oxide film. A gate electrode 14n is formed on the gate insulating film 13. The gate electrode 14n includes a conductor film including doped polysilicon that is made conductive by adding an impurity (e.g., phosphorus or arsenic). A side wall 18 is formed around the gate electrode 14n and a side surface of the gate electrode 14n is surrounded and covered by the side wall 18. The side wall 18 includes silicon nitride (SiN), for example.

The pMIS transistor 10p includes an n-type well 15 which is formed in the second semiconductor layer 2. A p+-type source region 16s and a p+-type drain region 16d are formed in a surface layer portion of the n-type well 15. A channel region 15c is interposed between the p+-type source region 16s and the p+-type drain region 16d. An end portion of the source region 16s on the channel region 15c side and an end portion of the drain region 16d on the channel region 15c side are shallow in depth and have a low impurity concentration. This forms an LDD structure that suppresses a short channel effect. A gate insulating film 17 is formed on the channel region 15c. The gate insulating film 17 may include a silicon oxide film. Alternatively, the gate insulating film 17 may include a silicon nitride film instead of or in addition to the silicon oxide film. A gate electrode 14p is formed on the gate insulating film 17. The gate electrode 14p includes a conductor film including doped polysilicon that is made conductive by adding an impurity (e.g., phosphorus or arsenic). The side wall 18 is formed around the gate electrode 14p and a side surface of the gate electrode 14p is surrounded and covered by the side wall 18. The side wall 18 includes SiN, for example.

The p-type well 11 and the n-type well 15 are formed in a surface layer portion of the second semiconductor layer 2 and spaced apart from the buried layer 41. In the vicinity of the front surface of the second semiconductor layer 2, an element isolation portion 19 is disposed between the p-type well 11 and the n-type well 15. The element isolation portion 19 may be a field insulating film such as local oxidation of silicon (LOCOS) and may have a shallow trench isolation (STI) structure. FIG. 2 illustrates an example of the STI structure. Specifically, the element isolation portion 19 has a structure in which an insulator such as silicon oxide is buried in its relatively shallow trench extending downward from the front surface of the second semiconductor layer 2 (e.g., a shallow trench having a depth of 0.2 to 0.5 μm). In the example illustrated in FIG. 2, the insulator protrudes slightly above the front surface of the second semiconductor layer 2.

An n+-type buried layer 42 is formed in the second device region R2. The buried layer 42 is formed so as to straddle the boundary between the second semiconductor layer 2 and the third semiconductor layer 3. The layer thickness of the buried layer 42 is, for example, in the range of 3 to 6 μm. The n-type impurity concentration (second conductivity type impurity concentration) of the buried layer 42 is, for example, in the range of 1E+18 to 1E+19 cm$^{-3}$.

In the present embodiment, an n-channel MIS transistor 20 is formed in the second device region R2. The n-channel MIS transistor 20 is, for example, of a high withstand voltage type with a withstand voltage of 10 V or higher and 100 V or lower (more specifically, for example, higher than 10 V; e.g., higher than 10 V and 30 V or lower, 15 V or higher and 30 V or lower, or 30 V or higher and 100 V or lower).

The MIS transistor 20 includes an n-type well 21 and a p-type well 25 which are formed in the second semiconductor layer 2. An n+-type contact region 22 is formed in a surface layer portion of the n-type well 21. The n+-type contact region 22 is doped with an n-type impurity in a higher concentration than the n-type well 21. The n-type well 21 and the contact region 22 forms a drain region 23. An n-type source region 26 is formed in the p-type well 25. A gate insulating film 27 is formed on the front surface of the second semiconductor layer 2 and located between the drain region 23 and the source region 26. The gate insulating film 27 may include a silicon oxide film. The gate insulating film 27 may include a silicon nitride film instead of or in addition to the silicon oxide film. The MIS transistor 20 includes a gate electrode 28 which faces the second semiconductor layer 2 across the gate insulating film 27.

The MIS transistor 20 includes a drain-gate isolation portion 24. The drain-gate isolation portion 24 has an STI structure in which an insulator such as silicon oxide is buried in its relatively shallow trench extending downward from the front surface of the second semiconductor layer 2 (e.g., a shallow trench having a depth of 0.2 to 0.5 μm). In the example illustrated in FIG. 2, the insulator protrudes slightly above the front surface of the second semiconductor layer 2. The drain-gate isolation portion 24 is spaced apart from the opposing region isolation structure 8 (boundary portion 8B) and extends substantially in parallel with the region isolation structure 8. The drain-gate isolation portion 24 is in contact with the drain region 23 in the second semiconductor layer 2 while being in contact with the gate electrode 28 above the second semiconductor layer 2. In this manner, the drain-gate isolation portion 24 isolates the drain region 23 and the gate electrode 28 from each other. The drain-gate isolation portion 24 is also in contact with the gate insulating film 27. While one side of the gate insulating film 27 is in contact with the drain-gate isolation portion 24, a distal end of the other side of the gate insulating film 27 is positioned on the p-type well 25. An upper surface of the gate insulating film 27 may be substantially flush with an upper surface of the drain-gate isolation portion 24.

The gate electrode 28 includes a conductor film including doped polysilicon that is made conductive by adding an impurity (e.g., phosphorus or arsenic), for example. A side wall is formed around the gate electrode 28. The side wall 29 includes SiN, for example. A side surface of the gate electrode 28 is surrounded and covered by the side wall 29.

The drain-gate isolation portion 24 secures a space between the drain region 23 and the gate insulating film 27, thereby isolating the drain region 23 and the gate insulating film 27 from each other with no contact therebetween. Accordingly, an electric field formed between the drain region 23 and the gate insulating film 27 is weakened. This configuration can prevent electric field concentration from occurring in the vicinity of the drain region 23 and the gate insulating film 27, thereby preventing breakdown of the gate insulating film 27 that would otherwise occur due to the electric field concentration. Therefore, even if the film thickness of the gate insulating film 27 is reduced, a high withstand voltage can be achieved. For example, even if the gate insulating film 27 has a film thickness of 130 Å or less, a high withstand voltage of approximately 30 V can still be achieved. Moreover, on-resistance can be reduced by reducing the film thickness of the gate insulating film 27. As a result, it is possible to improve the withstand voltage of the MIS transistor 20 while reducing on-resistance.

An interlayer insulating film 30 is formed so as to cover the first device region R1 and the second device region R2. In the first device region R1, the interlayer insulating film 30 covers the gate electrodes 14n and 14p. In the second device region R2, the interlayer insulating film 30 covers the gate electrode 28. The interlayer insulating film 30 is in contact with the front surface of the second semiconductor layer 2 in a region where the gate electrodes 14n, 14p, and 28 are not disposed. A thin insulating film (e.g., an oxide film) may be formed on the front surface of the second semiconductor layer 2. In this case, the interlayer insulating film 30 may be in contact with the thin insulating film. The interlayer insulating film 30 includes an insulating film such as an oxide film or a nitride film, for example.

The interlayer insulating film 30 has contact openings which expose the source regions 12s and 16s and the drain regions 12d and 16d in the first device region R1. The interlayer insulating film 30 has also contact openings 31 which expose the source region 26 and the contact region 22 in the second device region R2. Additionally, the interlayer insulating film 30 has a contact opening 31 which exposes a buried electrode 59 of the region isolation structure 8. The buried electrode 59 will be described in detail later. A metal plug 32 is buried in each of the contact openings 31. The metal plug 32 may be a tungsten plug.

An electrode film is formed on a front surface of the interlayer insulating film 30. In the first device region R1, the electrode film is separated into a source electrode 34s and a drain electrode 34d which correspond to the nMIS transistor 10n and also into a source electrode 35s and a drain electrode 35d which correspond to the pMIS transistor 10p. In the second device region R2, the electrode film is separated into a source electrode 36s and a drain electrode 36d which correspond to the MIS transistor 20. Moreover, the electrode film is separated into an electrode above the region isolation structure 8. Each electrode is joined to a top portion of the corresponding metal plug 32 and electrically connected to the corresponding region via the metal plug 32.

The electrode film may contain at least one of aluminum, copper, Al—Si—Cu (aluminum-silicon-copper) alloy, Al—Si (aluminum-silicon) alloy, and Al—Cu (aluminum-copper) alloy.

Figure 3:
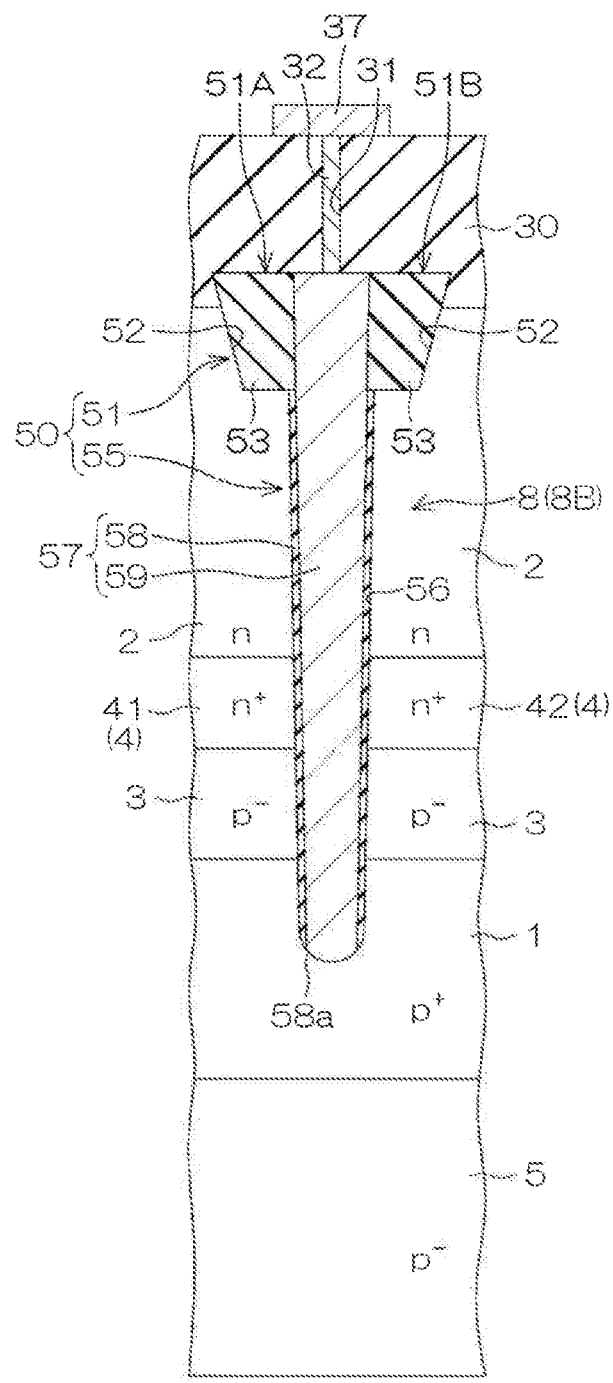
FIG. 3 is a partially enlarged sectional view illustrating an enlarged region isolation structure.

FIG. 3 is a partially enlarged sectional view illustrating the enlarged region isolation structure 8 in the sectional structure illustrated in FIG. 2. To simplify the drawing, the n-type well 15, the source region 16s, the n-type well 21, and the contact region 22 are not illustrated in FIG. 3.

The region isolation structure 8 is formed in a region (depth) extending from the front surface of the second semiconductor layer 2 to the first semiconductor layer 1. In the present embodiment, the region isolation structure 8 includes a trench isolation structure 50. The trench isolation structure 50 has a depth reaching the first semiconductor layer 1 from the front surface of the second semiconductor layer 2. More specifically, the trench isolation structure 50 includes an STI structure 51 and a deep trench isolation (DTI) structure 55. The STI structure 51 is formed in the vicinity of the front surface of the second semiconductor layer 2. The STI structure 51 includes a first portion 51A and a second portion 51B. The first portion 51A is formed on one side of the DTI structure 55 while the second portion 51B is formed on the other side of the DTI structure 55. The DTI structure 55 penetrates through the STI structure 51 and extends from a bottom portion of the STI structure 51 to the first semiconductor layer 1.

The STI structure 51 includes a shallow trench 52 and a buried material 53. The shallow trench 52 extends from the front surface of the second semiconductor layer 2 to a predetermined depth position (e.g., a depth of 0.2 to 0.5 μm) in the second semiconductor layer 2. The buried material 53 is buried in the shallow trench 52. In the present embodiment, the buried material 53 is an insulator (e.g., silicon oxide). The DTI structure 55 includes a deep trench 56 and a buried material 57. The deep trench 56 has a depth reaching the first semiconductor layer 1 from a front surface of the STI structure 51. The buried material 57 is buried in the deep trench 56.

The deep trench 56 penetrates through the n-type second semiconductor layer 2 and the p⁻-type third semiconductor layer 3 to the p⁺-type first semiconductor layer 1. In the present embodiment, a bottom portion of the deep trench 56 is positioned within the layer thickness of the first semiconductor layer 1. The shallow trench 52 and the deep trench 56 continuously form a trench having a depth reaching the first semiconductor layer 1 from the front surface of the second semiconductor layer 2. While the bottom portion of the deep trench 56 does not reach the p⁻-type semiconductor substrate 5 in the present embodiment, the bottom portion of the deep trench 56 may reach the p⁻-type semiconductor substrate 5.

During a manufacturing process, the buried layer 41 in the first device region R1 and the buried layer 42 in the second device region R2 may be formed as a single n⁺-type buried layer 4 in which the buried layer 41 and the buried layer 42 are continuously formed. In this case, the deep trench 56 is formed so as to penetrate through the single buried layer 4 and separate the buried layer 4 into the buried layer 41 in the first device region R1 and the buried layer 42 in the second device region R2. The deep trench 56 is in contact with these buried layers 41 and 42.

In the present embodiment, the buried material 57 includes an insulating film 58 and the buried electrode 59. The insulating film 58 is formed on an inner wall of the deep trench 56. The buried electrode 59 is buried in the deep trench 56 with the insulating film 58 interposed therebetween.

The insulating film 58 is formed on the inner wall of the deep trench 56. The insulating film 58 may include a silicon oxide film. Alternatively, the insulating film 58 may include a silicon nitride film instead of or in addition to the silicon oxide film. The insulating film 58 may, for example, have a thickness of 0.1 to 1.0 µm. In the present embodiment, while the insulating film 58 is formed on an inner side wall of the deep trench 56, the insulating film 58 is not formed on an inner bottom wall of the deep trench 56. In other words, the insulating film 58 has an opening 58a which exposes the bottom wall of the deep trench 56. The insulating film 58 is formed along the side wall of the deep trench 56 such that the insulating film 58 defines a trench-like space inside thereof. The buried electrode 59 is buried in this space.

In the present embodiment, the buried electrode 59 includes doped polysilicon that is made conductive by being doped with an impurity (e.g., boron or phosphorus). The buried electrode 59 is in contact with the bottom wall of the deep trench 56 through the opening 58a of the insulating film 58. That is, the buried electrode 59 is in contact with the p$^+$-type first semiconductor layer 1 in the bottom portion of the deep trench 56 and electrically connected to the first semiconductor layer 1.

The second semiconductor layer 2 is exposed to the side wall of the deep trench 56 and the exposed surface is covered by the insulating film 58. Therefore, the buried electrode 59 is insulated from the second semiconductor layer 2. The third semiconductor layer 3 is exposed to the side wall of the deep trench 56 and the exposed surface is covered by the insulating film 58. Therefore, the buried electrode 59 is insulated from the third semiconductor layer 3. In the example illustrated in FIG. 3, moreover, the buried layers 41 and 42 are exposed to the side wall of the deep trench 56 and the exposed surfaces are covered by the insulating film 58. Therefore, the buried electrode 59 is insulated from the buried layers 41 and 42. The first semiconductor layer 1 is exposed to the side wall of the deep trench 56 and the exposed surface is covered by the insulating film 58. The bottom portion of the deep trench 56 is positioned in the first semiconductor layer 1. The first semiconductor layer 1 is exposed to the bottom portion of the deep trench 56 through the opening 58a and is in contact with the buried electrode 59. Accordingly, the buried electrode 59 is joined to the first semiconductor layer 1 and electrically connected to the first semiconductor layer 1.

Instead of the STI structure 51, a field insulating film such as LOCOS may be disposed. In this case, the DTI structure 55 includes the deep trench 56 and the buried material 57; the deep trench 56 has a depth reaching the first semiconductor layer 1 through the field insulating film, and the buried material 57 is buried in the deep trench 56. Alternatively, the region isolation structure 8 may include the DTI structure 55 but not the STI structure 51 or the field insulating film. In this case, the DTI structure 55 includes the deep trench 56 and the buried material 57; the deep trench 56 reaches the first semiconductor layer 1 from the front surface of the second semiconductor layer 2, and the buried material 57 is buried in the deep trench 56.

The region isolation structure 8 is covered by the interlayer insulating film 30. In the interlayer insulating film 30, the contact opening 31 is formed directly on the region isolation structure 8. The metal plug 32 is buried in the contact opening 31. A bottom portion of the metal plug 32 is joined to the buried electrode 59 of the DTI structure 55 and electrically connected to the buried electrode 59. A top portion of the metal plug 32 is joined to the electrode 37. The electrode 37 includes an electrode film and formed on the interlayer insulating film 30.

Figure 4A:
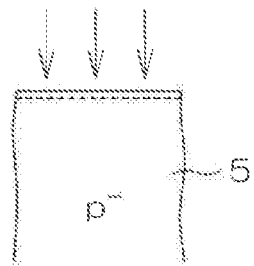
FIG. 4A is a sectional view for describing a process for manufacturing the semiconductor device.

FIGS. 4A to 4I are sectional views for describing a process for manufacturing the semiconductor device 100, mainly illustrating a process for manufacturing the region isolation structure 8. First, as illustrated in FIG. 4A, the p$^-$-type semiconductor substrate 5 (e.g., a silicon substrate) is provided, and p-type impurity ions such as boron are implanted into the front surface of the semiconductor substrate 5.

Figure 4B:
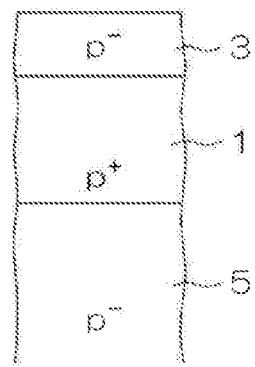
FIG. 4B is a sectional view for describing the process for manufacturing the semiconductor device.

Next, as illustrated in FIG. 4B, epitaxial growth (e.g., silicon crystal growth) is performed on the front surface of the semiconductor substrate 5 while the p-type impurity is added thereto. This diffuses the ion-implanted p-type impurity across a boundary portion between the semiconductor substrate 5 and an epitaxial layer. As a result, the p$^+$-type first semiconductor layer 1 is formed on the semiconductor substrate 5. Moreover, the p$^-$-type third semiconductor layer 3 is formed on the first semiconductor layer 1.

Figure 4C:
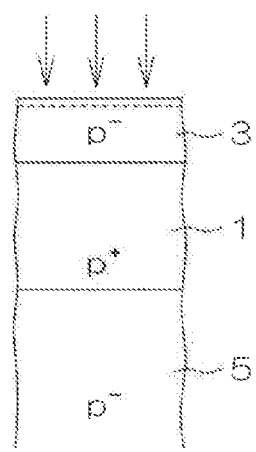
FIG. 4C is a sectional view for describing the process for manufacturing the semiconductor device.

Next, as illustrated in FIG. 4C, n-type impurity ions are implanted into the front surface of the third semiconductor layer 3. The ion implantation may be selectively performed in the regions where the buried layers 41 and 42 are to be formed. Alternatively, the single buried layer 4 may be formed over an entire active region of the semiconductor substrate 5. In this case, the n-type impurity ions are also implanted into the region where the region isolation structure 8 is to be formed. Examples of the n-type impurity include phosphorus and arsenic.

Figure 4D:
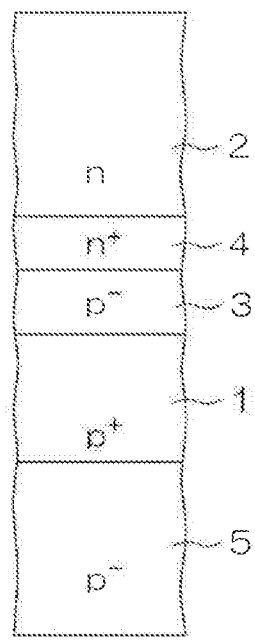
FIG. 4D is a sectional view for describing the process for manufacturing the semiconductor device.

Next, as illustrated in FIG. 4D, epitaxial growth (e.g., silicon crystal growth) is performed on the front surface of the third semiconductor layer 3 while the n-type impurity is added thereto. This diffuses the ion-implanted n-type impurity across a boundary portion between the third semiconductor layer 3 and an epitaxial layer. As a result, the n$^+$-type buried layer 4 (41, 42) is formed on the third semiconductor layer 3. Moreover, the n-type second semiconductor layer 2 is formed on the buried layer 4 (41, 42).

Figure 4E:
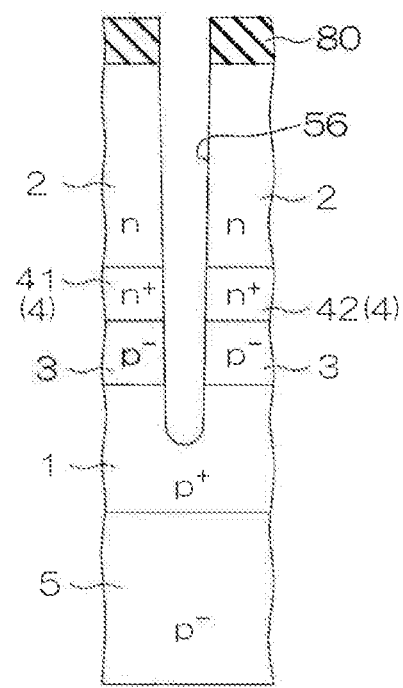
FIG. 4E is a sectional view for describing the process for manufacturing the semiconductor device.

Nest, as illustrated in FIG. 4E, a hard mask 80 (e.g., a silicon oxide film) which corresponds to the deep trench 56 is formed. Dry etching via the hard mask 80 forms the deep trench 56. The deep trench 56 separates the second semiconductor layer 2 and the third semiconductor layer 3 into portions corresponding to the first and second device regions R1 and R2. Moreover, the deep trench 56 separates the buried layer 4 into the buried layer 41 which corresponds to the first device region R1 and the buried layer 42 which corresponds to the second device region R2.

Figure 4F:
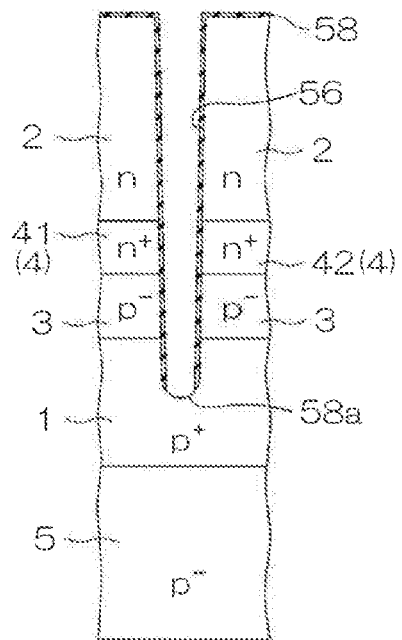
FIG. 4F is a sectional view for describing the process for manufacturing the semiconductor device.

Subsequently, the hard mask 80 is removed, and the insulating film 58 is formed as illustrated in FIG. 4F. For example, the insulating film 58 is formed by thermal oxidation of the front surface. The insulating film 58 covers the front surface of the second semiconductor layer 2 and the inner wall of the deep trench 56. After that, selective etching is performed such that the opening 58a is formed in the insulating film 58 in the bottom portion of the deep trench 56.

Figure 4G:
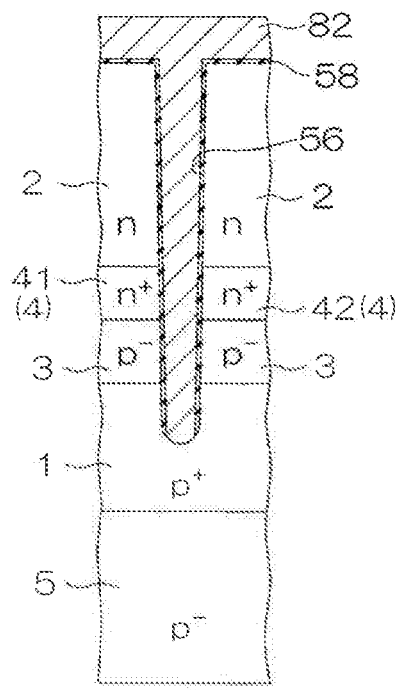
FIG. 4G is a sectional view for describing the process for manufacturing the semiconductor device.

Next, as illustrated in FIG. 4G, a polysilicon film 82 is formed so as to be buried in the deep trench 56 with the insulating film 58 interposed therebetween. The polysilicon film 82 may be formed by a low-pressure chemical vapor deposition (CVD) method. The polysilicon film 82 is a conductor film including a doped polysilicon film that is made conductive by being doped with an impurity (e.g., phosphorus or arsenic). After that, the polysilicon film 82 is patterned such that unnecessary portions are removed therefrom. Moreover, the insulating film 58 on the front surface (principal surface outside the deep trench 56) of the second semiconductor layer 2 is removed. As a result, the buried electrode 59 is buried in the deep trench 56 with the insulating film 58 interposed therebetween. The polysilicon film 82 may be patterned so as to form the gate electrodes 14n and 14p in the first device region R1 and the gate electrode 28 in the second device region R2.

Figure 4H:
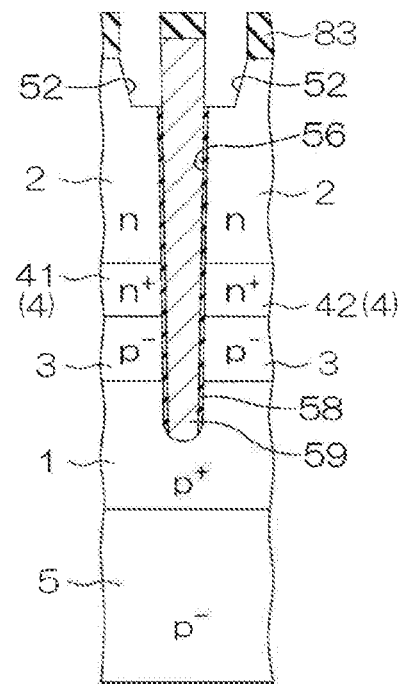
FIG. 4H is a sectional view for describing the process for manufacturing the semiconductor device.

Next, as illustrated in FIG. 4H, the STI structure 51 is formed. Specifically, a silicon oxide film, not illustrated, is formed by oxidizing the front surface of the second semiconductor layer 2. Next, a silicon nitride film, not illustrated, is laminated on the silicon oxide film by the CVD method. On top of the silicon nitride film, a resist pattern 83 is formed. The resist pattern 83 corresponds to the shallow trench 52. The resist pattern 83 covers the buried electrode 59 above the deep trench 56. The silicon nitride film, the silicon oxide film, and the second semiconductor layer 2 are etched using the resist pattern 83 as a mask. This forms the shallow trench 52.

Figure 4I:
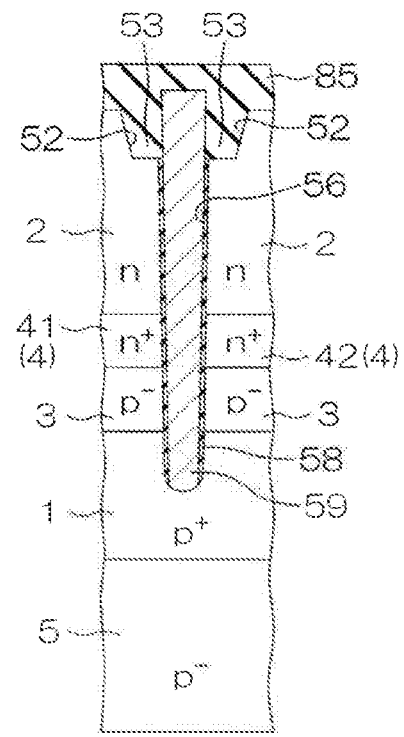
FIG. 4I is a sectional view for describing the process for manufacturing the semiconductor device.

As illustrated in FIG. 4I, after the resist pattern 83 is removed, a thick silicon oxide film 85 is formed by the CVD method, and the buried material 53 is buried in the shallow trench 52. The buried material 53 includes an insulator (a silicon oxide film). After that, any unnecessary silicon oxide film 85 on the silicon nitride film and the shallow trench 52 is removed by a chemical mechanical polishing (CMP) method. Subsequently, the silicon nitride film on the front surface of the second semiconductor layer 2 is removed. When the STI structure 51 is formed, the element isolation portion 19 and the drain-gate isolation portion 24 (see FIG. 2) may also be formed at the same time.

After that, the interlayer insulating film 30 is formed. Then, the contact openings 31 which penetrate through the interlayer insulating film 30 are formed. The metal plug 32 (e.g., a tungsten plug) is buried in each of the contact openings 31. Subsequently, the electrode film that is connected to the metal plugs 32 is formed on the interlayer insulating film 30 and patterned. This forms the electrodes 34s, 34d, 35s, 35d, 36s, 36d, and 37 (see FIG. 2).

In this manner, the semiconductor device 100 according to the present embodiment includes the semiconductor substrate 5 of the first conductivity type (the p type in the present embodiment) and the first semiconductor layer 1 of the first conductivity type which is formed on the semiconductor substrate 5 and has a first conductivity type impurity concentration higher than that of the semiconductor substrate 5. The semiconductor device 100 includes the second semiconductor layer 2 of the second conductivity type (the n type in the present embodiment) which is formed above the first semiconductor layer 1. The first device region R1 and the second device region R2 are provided in the second semiconductor layer 2. The first device region R1 operates based on the first reference voltage (e.g., 1 V or higher and 10 V or lower). The second device region R2 is spaced apart from the first device region R1. The second device region R2 operates based on the second reference voltage (e.g., 10 V or higher and 100 V or lower) different from the first reference voltage (e.g., higher than the first reference voltage). The region isolation structure 8 is interposed between the first device region R1 and the second device region R2. The region isolation structure 8 is formed in the region extending from the front surface (principal surface) of the second semiconductor layer 2 to the first semiconductor layer 1. The region isolation structure 8 electrically isolates the first device region R1 and the second device region R2 from each other.

With this configuration, the first device region R1 and the second device region R2, which are formed in the second semiconductor layer 2 of the second conductivity type (the n type in the present embodiment), are electrically isolated from each other by the region isolation structure 8 and operate based on different reference voltages. The region isolation structure 8 is formed in the region extending from the front surface of the second semiconductor layer 2 to the first semiconductor layer 1 of the first conductivity type (the p type in the present embodiment). The first conductivity type impurity concentration (p-type impurity concentration in the present embodiment) of the first semiconductor layer 1 is relatively high. Thus, the first semiconductor layer 1, which has the high first conductivity type impurity concentration (the p type in the present embodiment), is disposed in a current path that passes under the region isolation structure 8 and straddles between the first and second device regions R1 and R2. Therefore, carriers entering the first semiconductor layer 1 from the second semiconductor layer 2 are lost due to recombination in the first semiconductor layer 1. This configuration can reliably suppress or prevent leakage current between the first and second device regions R1 and R2. This configuration can, therefore, improve the region isolation performance, thereby improving the device properties of the respective first and second device regions R1 and R2.

In the present embodiment, the region isolation structure 8 includes the trench isolation structure 50. The trench isolation structure 50 has a depth reaching the first semiconductor layer 1 from the front surface of the second semiconductor layer 2. More specifically, the trench isolation structure 50 includes the trenches 52 and 56 and the buried materials 53 and 57. In combination, the trenches 52 and 56 have a depth reaching the first semiconductor layer 1 from the front surface of the second semiconductor layer 2. The buried materials 53 and 57 are buried in the trenches 52 and 56, respectively. In the present embodiment, the trenches 52 and 56 include the shallow trench 52 (first trench) and the deep trench 56 (second trench), respectively. The shallow trench 52 extends from the front surface of the second semiconductor layer 2 to the predetermined depth in the second semiconductor layer 2 and has the bottom portion in the second semiconductor layer 2. The deep trench 56 is formed narrower than the shallow trench 52. The deep trench 56 penetrates through the second semiconductor layer 2 from the bottom portion of the shallow trench 52 to the first semiconductor layer 1.

The trench isolation structure 50 with the configuration above can increase the length of the current path between the first device region R1 and the second device region R2. Moreover, the first semiconductor layer 1, which has the high first conductivity type impurity concentration, is disposed in the current path. This configuration can, therefore, effectively suppress or prevent leakage current between the first and second device regions R1 and R2.

In the present embodiment, the buried materials include the insulating film 58 and the buried electrode 59. The insulating film 58 is formed on the inner wall of the deep trench 56. The buried electrode 59 is buried in the deep trench 56 with the insulating film 58 interposed therebetween. With this configuration, it is possible to appropriately control the electric field in the vicinity of the region isolation structure 8, thereby improving the region isolation performance.

In the present embodiment, the buried electrode 59 and the first semiconductor layer 1 are electrically connected to each other so as to have the same potential as each other. Specifically, the insulating film 58, which is formed on the inner wall of the deep trench 56, has the opening 58*a*. Since the opening 58*a* exposes the bottom wall of the deep trench 56, the buried electrode 59 is in contact with the first semiconductor layer 1 through the opening 58*a*. With this configuration, the potential of the first semiconductor layer 1 can be controlled. Specifically, the electrode 37, which is connected to the buried electrode 59 through the metal plug 32, is connected to an appropriate potential (e.g., a ground potential). Accordingly, it is possible to control the potential of the first semiconductor layer 1, thereby increasing a carrier loss effect.

In the present embodiment, moreover, the third semiconductor layer 3 is formed between the first semiconductor layer 1 and the second semiconductor layer 2. The first conductivity type impurity concentration (p-type impurity concentration in the present embodiment) of the third semiconductor layer 3 is lower than that of the first semiconductor layer 1. This configuration can effectively isolate the first and second device regions R1 and R2 from each other and improve the withstand voltage.

Figure 8:
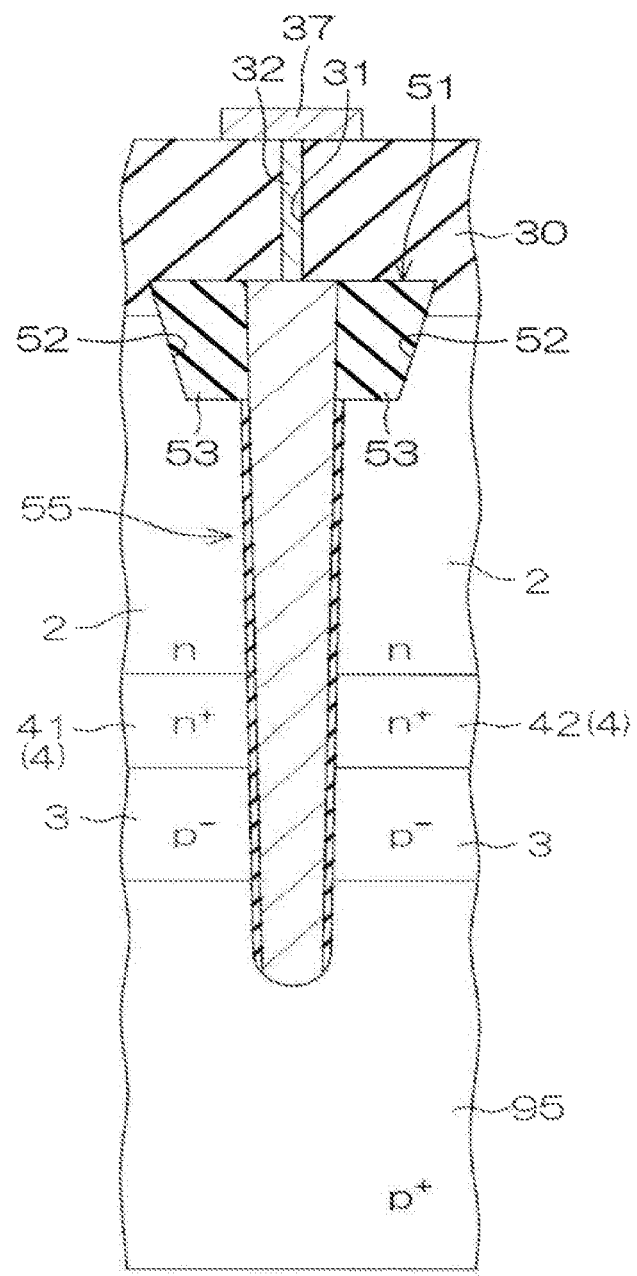
FIG. 8 is a sectional view of a structure of a comparative example.

FIG. 8 illustrates the structure of a comparative example. This comparative example includes a p$^+$-type semiconductor substrate 95. Moreover, the p$^-$-type third semiconductor layer 3 and the n-type second semiconductor layer 2 are laminated on the semiconductor substrate 95. The region isolation structure 8 has the same structure as the region isolation structure 8 according to the above-described embodiment. The bottom portion of the region isolation structure 8 reaches the p$^+$-type semiconductor substrate 95.

One disadvantage of employing the comparative example with this structure is the manufacturing cost of the p$^+$-type semiconductor substrate 95. That is, the p$^+$-type semiconductor substrate 95 is higher in the manufacturing cost than the p$^-$-type semiconductor substrate.

Another disadvantage is auto-doping caused by the p$^+$-type semiconductor substrate 95. Specifically, there is the possibility that a p$^+$-type impurity is released from the p$^+$-type semiconductor substrate 95 and the front surface of the second semiconductor layer 2 is auto-doped with the released p$^+$-type impurity during a manufacturing process (particularly, a heat treatment step). This issue can be avoided or mitigated by sealing (back sealing) an exposed surface of the p$^+$-type semiconductor substrate 95 with a silicon oxide film or the like. However, such a workaround increases the steps of the manufacturing process, thereby increasing the manufacturing cost. Moreover, there is the possibility that the semiconductor wafer is warped due to the back sealing.

Figure 5:
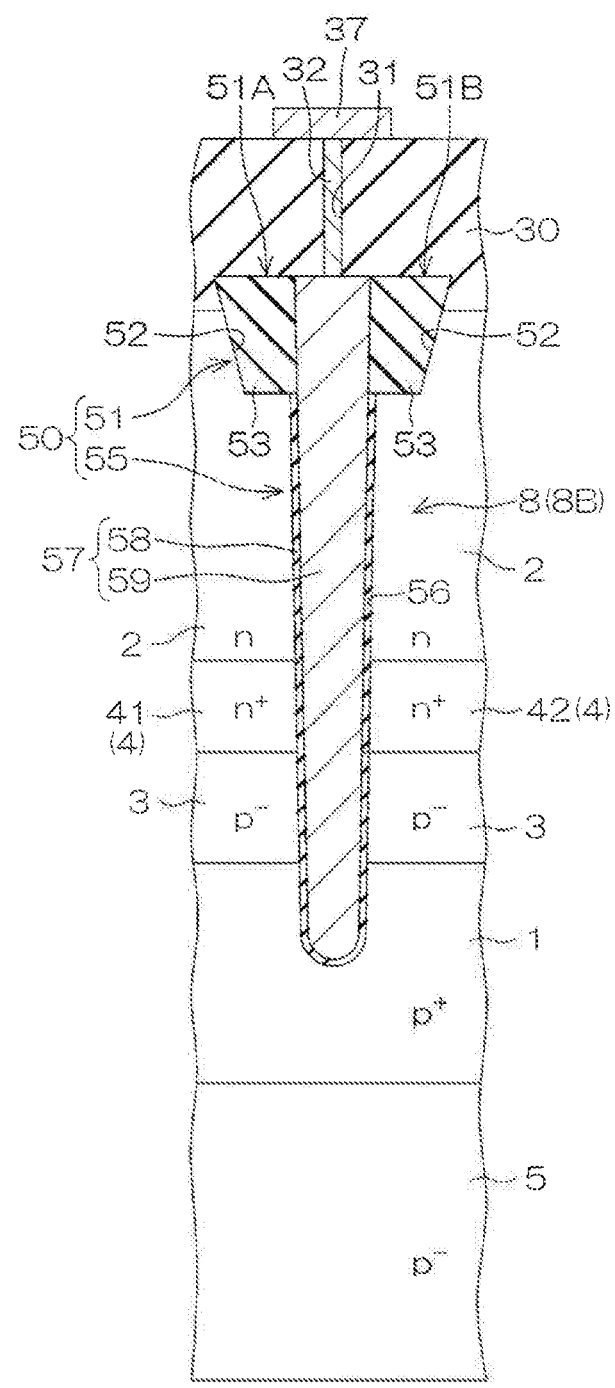
FIG. 5 is an enlarged sectional view of a configuration of a region isolation structure of a semiconductor device according to a second embodiment of the present disclosure.

FIG. 5 illustrates a configuration of the semiconductor device 100 according to a second embodiment of the present disclosure. Specifically, FIG. 5 is an enlarged sectional view of the region isolation structure 8 of the semiconductor device 100 according to the second embodiment. In the present embodiment, the insulating film 58 covers not only the inner side wall of the deep trench 56 but also the inner bottom wall of the deep trench 56. In other words, the insulating film 58 has no opening in the bottom portion of the deep trench 56, covering the entire inner wall of the deep trench 56. Therefore, the buried electrode 59, which is buried in the deep trench 56, is not in contact with the p$^+$-type first semiconductor layer 1.

It is preferable that the first semiconductor layer 1 be connected to an electrode having the same potential as the electrode 37 in a portion other than the trench isolation structure 50. This allows the first semiconductor layer 1 to be electrically connected to the buried electrode 59, making the first semiconductor layer 1 and the buried electrode 59 have the same potential (e.g., a ground potential) as each other.

The region isolation structure 8 according to the present embodiment can be manufactured by omitting an etching step of forming the opening 58*a* in the insulating film 58 in the bottom portion of the deep trench 56 during the manufacturing process according to the first embodiment.

Figure 6:
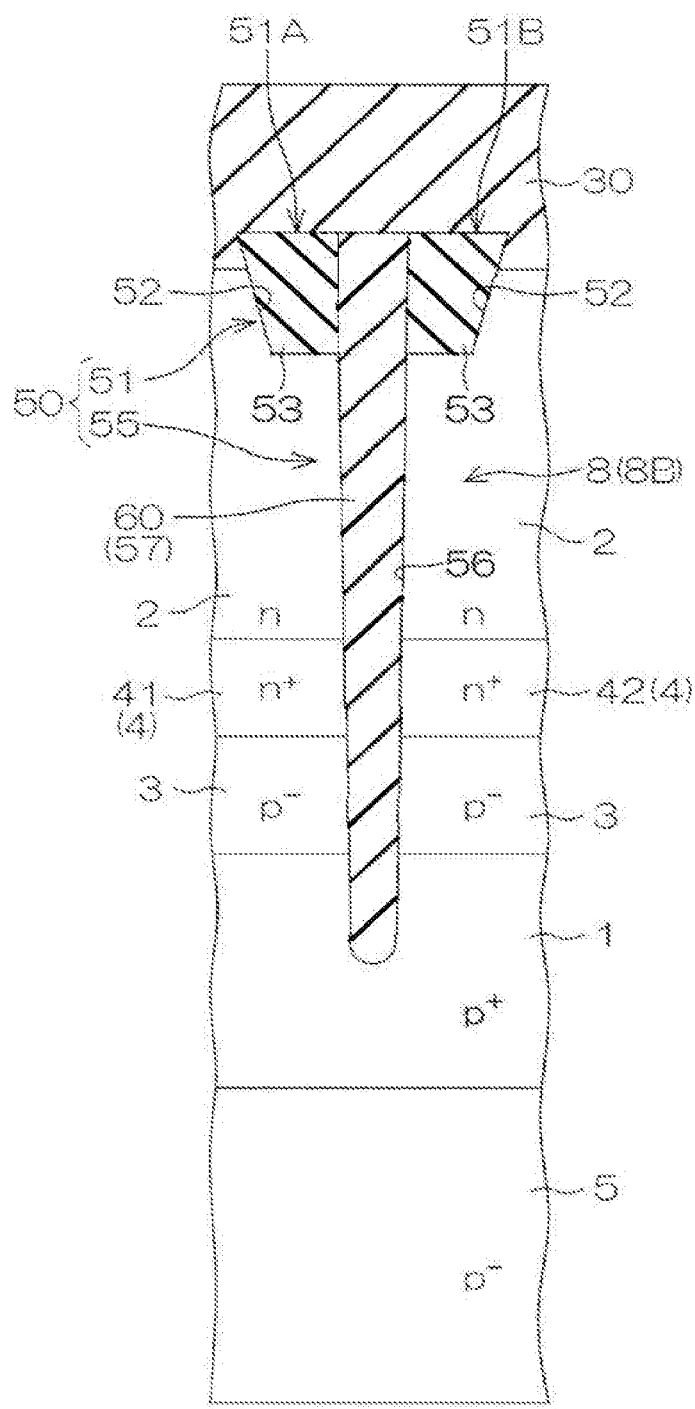
FIG. 6 is an enlarged sectional view of a configuration of a region isolation structure of a semiconductor device according to a third embodiment of the present disclosure.

FIG. 6 illustrates a configuration of the semiconductor device 100 according to a third embodiment of the present disclosure. Specifically, FIG. 6 is an enlarged sectional view of the region isolation structure 8 of the semiconductor device 100 according to the third embodiment. In the present embodiment, the buried material 57, which is buried in the deep trench 56, is an insulator 60. That is, the metal layer (buried electrode 59) according to the first and second embodiments is not buried in the deep trench 56. The first semiconductor layer 1 may be connected to an appropriate potential (e.g., a ground potential) in a portion other than the trench isolation structure 50.

The region isolation structure 8 according to the present embodiment can be manufactured by, for example, making the opening width of the deep trench 56 narrower than that of the deep trench 56 according to the first embodiment and filling the inside of the deep trench 56 with the insulating film 58 (an example of the insulator 60) in the manufacturing process according to the first embodiment.

Figure 7:
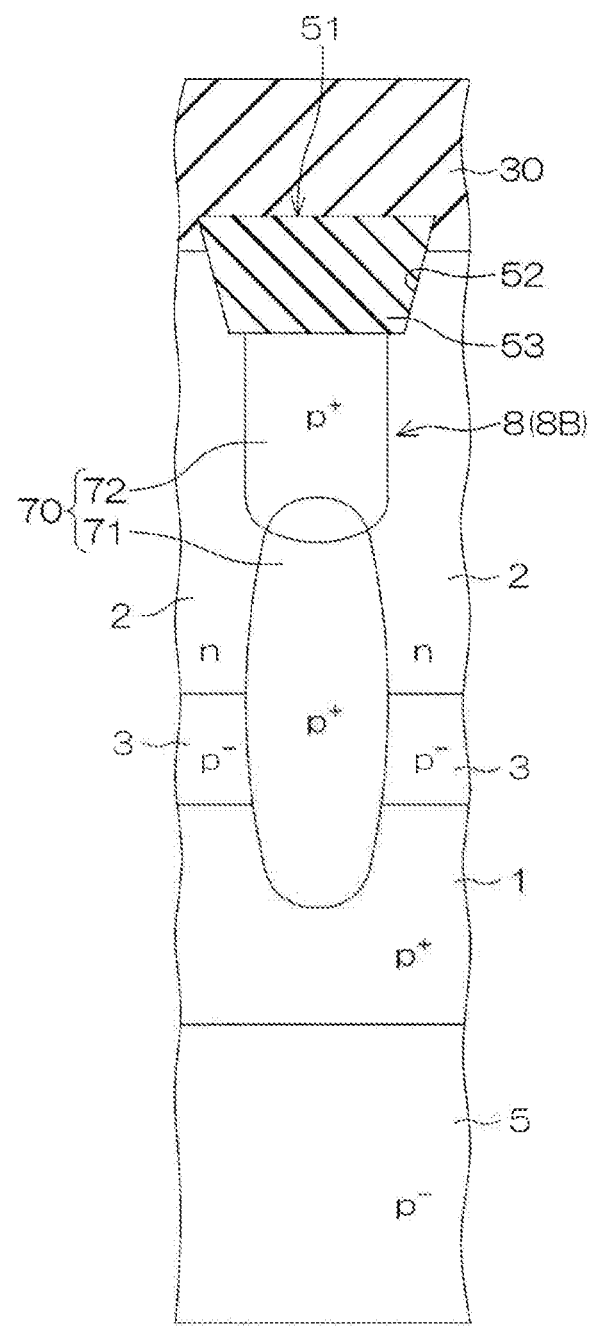
FIG. 7 is an enlarged sectional view of a configuration of a region isolation structure of a semiconductor device according to a fourth embodiment of the present disclosure.

FIG. 7 illustrates a configuration of the semiconductor device 100 according to a fourth embodiment of the present disclosure. Specifically, FIG. 7 is an enlarged sectional view of the region isolation structure 8 of the semiconductor device 100 according to the fourth embodiment. The region isolation structure 8 according to the present embodiment includes a p$^+$-type column region 70. The column region 70 is formed in a region extending from the front surface of the second semiconductor layer 2 to the first semiconductor layer 1. The column region 70 is formed in a column shape in cross section. In planar view, the column region 70 extends in a band shape along the front surface of the second semiconductor layer 2 according to the planar shape (see FIG. 1) of the region isolation structure 8.

The column region 70 includes a p$^+$-type buried layer 71 and a p$^+$-type well 72. The p$^+$-type buried layer 71 extends upward and downward from a boundary portion between the third semiconductor layer 3 and the second semiconductor layer 2. The p$^+$-type well 72 is formed in the surface layer portion of the second semiconductor layer 2. A lower portion of the p$^+$-type well 72 and an upper portion of the p$^+$-type buried layer 71 overlap with each other so as to be connected to each other. The p$^+$-type buried layer 71 reaches the p$^+$-type first semiconductor layer 1 through the third semiconductor layer 3. The p$^+$-type column region 70 is, therefore, formed in the region extending from the front surface of the second semiconductor layer 2 to the first semiconductor layer 1.

In the present embodiment, the region isolation structure 8 includes the STI structure 51 described in the first and second embodiments. The column region 70 is disposed immediately under the STI structure 51. The STI structure 51 may be omitted. Although not illustrated in FIG. 7, the column region 70 may be electrically connected to an electrode formed on the interlayer insulating film 30 through a metal plug that penetrates through the interlayer insulating film 30 (and also penetrates through the STI structure 51 if necessary). Accordingly, the column region 70 can be controlled to an appropriate reference potential (e.g., a ground potential) through the electrode.

To form the p$^+$-type buried layer 71, for example, before or after the step illustrated in FIG. 4C, p-type impurity ions are selectively implanted into a region of the p$^-$-type third semiconductor layer 3 where the region isolation structure 8 is to be formed. After that, in the step illustrated in FIG. 4D in which the second semiconductor layer 2, that is, the epitaxial layer is grown, the p-type impurity is diffused. As a result, the p$^+$-type buried layer 71 and the n$^+$-type buried layers 41 and 42 are formed at the same time. In this case, it is preferable that implantation of n-type impurity ions for the buried layers 41 and 42 (see FIG. 4C) be selectively performed in respective predetermined regions of the first and second device regions R1 and R2, and the n$^+$-type buried layers 41 and 42 be separately formed in the respective regions spaced in respective inward directions from the region isolation structure 8 in the respective first and second device regions R1 and R2. The p$^+$-type well 72 can be formed at the same time as the p-type well 11 in the first device region R1 and the p-type well 25 in the second device region R2.

The configuration described above can also provide the effects described in the first embodiment.

Although the embodiments of the present disclosure have been described as above, the present disclosure can be implemented in still other modes. For example, although the first conductivity type is the p type and the second conductivity type is the n type in the above-described embodiments, the first conductivity type may be the n type and the second conductivity type may be the p type. This configuration can be implemented by replacing the p-type regions by the n-type regions and the n-type regions by the p-type regions in the above description and accompanying drawings. Various other design changes can be made within the scope of the claims.

What is claimed is:

1. A semiconductor device, comprising:
a semiconductor substrate of a first conductivity type;
a first semiconductor layer of the first conductivity type formed on the semiconductor substrate, wherein the first semiconductor layer has a first conductivity type impurity concentration higher than a first conductivity type impurity concentration of the semiconductor substrate;
a second semiconductor layer of a second conductivity type formed above the first semiconductor layer;
a first device region formed in the second semiconductor layer and configured to operate based on a first reference voltage;
a second device region formed in the second semiconductor layer and configured to operate based on a second reference voltage different from the first reference voltage, the second device region being spaced apart from the first device region; and
a region isolation structure between the first device region and the second device region, wherein
the region isolation structure is in a region extending from a front surface of the second semiconductor layer to the first semiconductor layer so as to electrically isolate the first device region and the second device region from each other,
the region isolation structure includes a trench isolation structure having a first depth reaching the first semiconductor layer from the front surface of the second semiconductor layer,
the trench isolation structure includes:
a trench having a second depth reaching the first semiconductor layer from the front surface of the second semiconductor layer; and
a buried material buried in the trench,
the buried material includes an insulating film formed on an inner wall of the trench, and a buried electrode buried in the trench with the insulating film between the buried electrode and the trench,
the buried electrode includes doped polysilicon,
the buried electrode is electrically connected to the first semiconductor layer such that the buried electrode has a potential same as a potential of the first semiconductor layer,
the insulating film has an opening that exposes a bottom wall of the trench, and
the buried electrode is in contact with the first semiconductor layer through the opening.

2. The semiconductor device according to claim 1, wherein the insulating film covers an entire surface of the inner wall of the trench.

3. The semiconductor device according to claim 1, wherein the trench includes:
a first trench part extending from the front surface of the second semiconductor layer to a predetermined depth in the second semiconductor layer and having a bottom portion in the second semiconductor layer; and
a second trench part formed narrower than the first trench part and penetrating through the second semiconductor layer from the bottom portion of the first trench part to the first semiconductor layer.

4. The semiconductor device according to claim 1, wherein the region isolation structure further includes a column region of the first conductivity type formed in the region extending from the front surface of the second semiconductor layer to the first semiconductor layer.

5. The semiconductor device according to claim 1, further comprising: a third semiconductor layer of the first conductivity type formed between the first semiconductor layer and the second semiconductor layer, wherein the third semiconductor layer has a first conductivity type impurity concentration lower than the first conductivity type impurity concentration of the first semiconductor layer.

* * * * *